United States Patent [19]
Ashuri

[11] Patent Number: 5,757,818
[45] Date of Patent: May 26, 1998

[54] METHOD AND APPARATUS FOR SCAN OUT TESTING OF INTEGRATED CIRCUITS WITH REDUCED TEST CIRCUIT AREA

[75] Inventor: Roni Ashuri, Yaakov, Israel

[73] Assignee: Intel Corporation, Santa Clara, Calif.

[21] Appl. No.: 756,682

[22] Filed: Nov. 26, 1996

[51] Int. Cl.$^6$ .................................................. G01R 31/28
[52] U.S. Cl. ............................. 371/22.31; 371/22.32; 371/22.34
[58] Field of Search ............... 371/22.32, 22.31, 371/22.34, 21.1; 365/189.02, 189.12, 201, 221

[56] References Cited

U.S. PATENT DOCUMENTS

| | | | |
|---|---|---|---|
| 5,253,255 | 10/1993 | Carbine | 371/22.3 |
| 5,448,166 | 9/1995 | Parker et al. | 324/158.1 |
| 5,465,053 | 11/1995 | Edwards | 324/770 |
| 5,488,731 | 1/1996 | Mendelsohn | 371/49.1 |
| 5,583,787 | 12/1996 | Underwood et al. | 371/22.3 |

*Primary Examiner*—Hoa T. Nguyen
*Attorney, Agent, or Firm*—Blakely, Sokoloff, Taylor & Zafman

[57] ABSTRACT

An apparatus for sampling logic states of a plurality of nodes of an integrated circuit. A selector circuit is coupled to the plurality of nodes of the integrated circuit and to a scan cell. The selector circuit comprises a plurality of control inputs, wherein each combination of logic states of the plurality of control inputs causes the selector circuit to output to the scan cell a logic value of a particular one of the nodes of the integrated circuit.

8 Claims, 3 Drawing Sheets

5,757,818

METHOD AND APPARATUS FOR SCAN OUT TESTING OF INTEGRATED CIRCUITS WITH REDUCED TEST CIRCUIT AREA

FIELD OF THE INVENTION

The present invention relates to the field of integrated circuits. More particularly the present invention relates to testing very large scale integration (VLSI) integrated circuits.

BACKGROUND OF THE INVENTION

The size of VLSI circuits continues to increase. Also, the number of circuit devices per unit area continues to increase for VLSI circuits. A consequence of these trends is that it becomes increasingly difficult to test VLSI circuits satisfactorily. Known methods of testing VLSI circuits have limitations that become exacerbated as circuit size and density increase. For example, the commonly used method of sampling internal nodes of the circuits during operation ("scan out") requires that some area of the integrated circuit be devoted to testing circuitry. Although it might be desirable, it is usually not possible to sample every node in a circuit, particularly as circuits become extremely large. With the increasing demand for integrated circuit density, it becomes more difficult to devote silicon area to test circuitry, thus making it difficult to sample more circuit nodes as circuit density increases.

What is needed is a method and apparatus for allowing the sampling of increased numbers of circuit nodes while minimizing the increase in silicon area used by testing circuitry. As will be shown, the present invention allows an increase in the number of circuit nodes sampled by an integer factor while increasing silicon area used by a very small amount or not at all.

SUMMARY OF THE INVENTION

An apparatus for sampling logic states of a plurality of nodes of an integrated circuit is described. A selector circuit is coupled to a plurality of nodes of the integrated circuit and to a scan cell. The selector circuit comprises a plurality of control inputs, wherein each combination of logic states of the plurality of control inputs causes the selector circuit to output to the scan cell a logic value of a particular one of the nodes of the integrated circuit. In one embodiment, the present invention provides a selector circuit interposed between VLSI logic and a scan cell. The selector circuit is controlled by a select input originating in control logic of the VLSI chip. The select input allows one of multiple nodes of the VLSI circuit to be sampled by a single scan cell.

DETAILED DESCRIPTION

In the following detailed description of the present invention numerous specific details are set forth in order to provide a thorough understanding of the present invention. However, it will be obvious to one skilled in the art that the present invention may be practiced without these specific details. In other instances, well known methods, procedures, components, and circuits have not been described in detail in order to avoid obscuring the present invention.

The present invention includes test circuitry that allows at least twice as many nodes of a VLSI circuit to be tested without appreciably increasing silicon area devoted to test circuitry.

Figure 1:
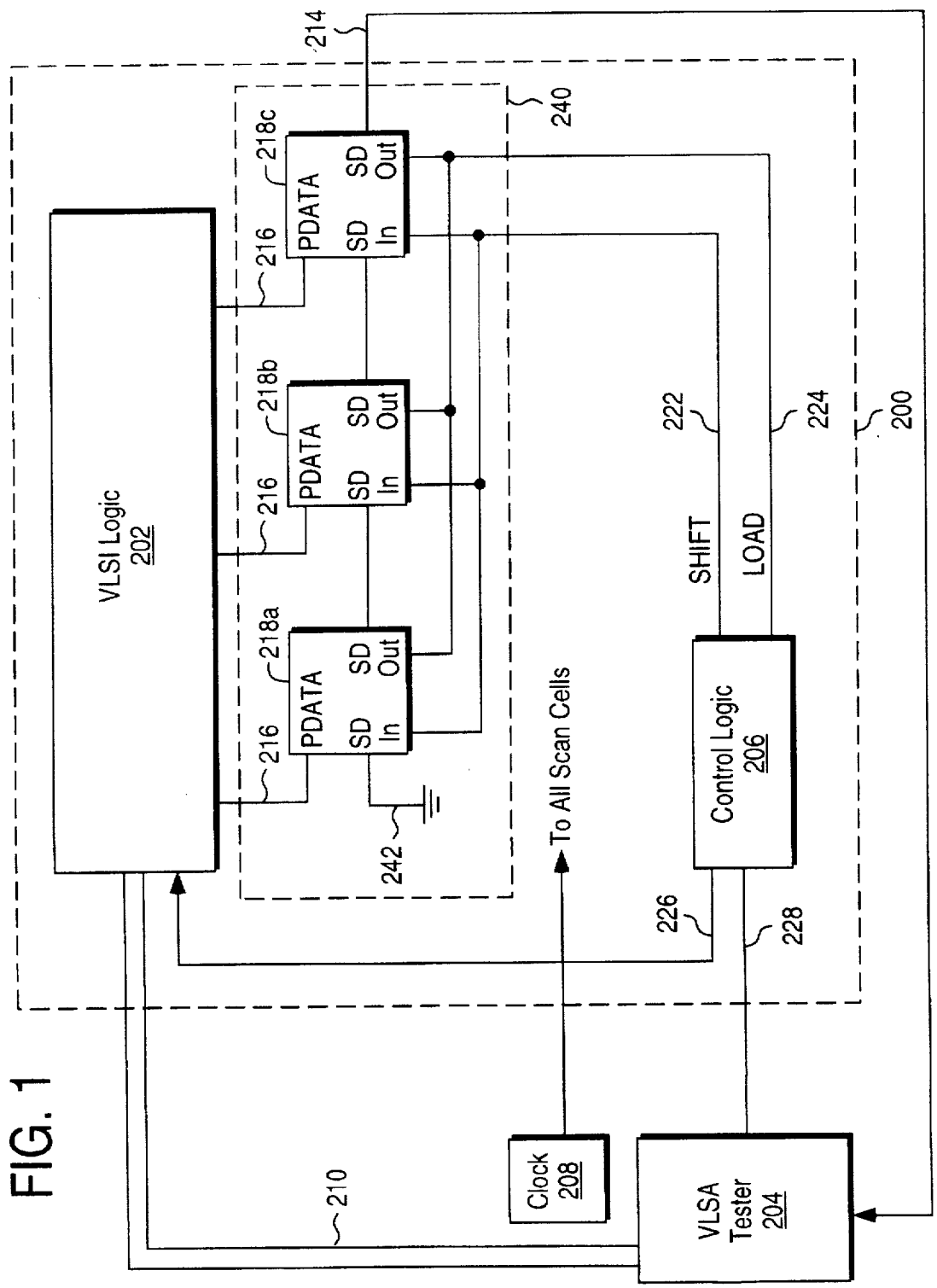
FIG. 1 is a block diagram of a prior art integrated circuit chip including test circuitry.

FIG. 1 is a block diagram of prior art VLSI chip 200 and external test equipment. VLSI logic 202 includes the circuitry required to perform the function for which VLSI chip 200 was designed. For example, VLSI chip 200 could be a microprocessor chip.

To facilitate testing of VLSI chip 200, test circuitry 240 is included on VLSI chip 200. Test circuitry 240 allows the states of hundreds of internal signals of VLSI logic 202 to be viewed as VLSI chip 200 operates. Test circuitry 240 comprises 3 scan cells 218. Only 3 scan cells 218 are shown for clarity. In a practical VLSI chip, test circuitry includes hundreds of scan cells. Each scan cell 218 includes a PDATA input coupled to a single node of VLSI logic circuitry 202. Scan cells 218 also include a serial data input (SDIN) and serial data output (SDOUT). As shown, scan cells 218 are connected to each other by their SDIN and SDOUT inputs and outputs. Scan cells 218 together form a shift register that receives data in parallel from VLSI logic 202, shifts the data serially left to right and outputs it on the serial data output of scan cell 218c. Scan cell 218a is the leading cell of the shift register, therefore its serial data input 242 is connected to ground. This is because leading scan cell 218a does not receive serial data from another scan cell. Test circuitry 240 operates in the following manner. Clock circuit 208 provides a clock signal to each scan cell 218 of test circuitry 240. The clock inputs of each scan cell 218 are not shown for clarity. VLSI tester 204 includes circuitry and software external to VLSI chip 200. For testing operations, VLSI tester 204 is connected to VLSI chip 200 through both serial data output 214 of test circuitry 240 and through multiple data lines 210. VLSI tester 204 is programmed to input signals to VLSI logic 202 through multiple data lines 210. The signals cause VLSI logic 202 to execute particular operations. VLSI tester 204 outputs control signals 228 to control logic 206. Control logic 206 receives an enables signal from VLSI tester 204 as one of control signals 228 and outputs it to VLSI logic 202 as test enable signal 226. Test enable signal 226 causes VLSI logic 202 to enter test mode. In test mode VLSI logic 202 is exercised by signals from VLSI tester 204 on multiple data lines 210. Under control of logic control 206 test circuitry 240 takes data in parallel from nodes of VLSI logic circuitry 202 on data lines 216, serially shifts the data and outputs it on serial output 214. SHIFT signal 222 and load signal 224 cause the scan cells 218 of test circuitry 240 to shift and load data respectively as coordinated by VLSI tester 204. Serial data output on serial output 214 to VLSI tester 204 is interpreted by VLSI tester 204. Because VLSI tester 204 directs certain operations to be performed by VLSI logic 202, certain output data is expected on serial data output 214. If the data is not as expected, errors have occurred and can be identified by VLSI tester 204.

A disadvantage of prior VLSI chips like VLSI chip 200 is that it is necessary to add additional scan cells 218 for each additional node of VLSI logic circuitry 202 it is desired to sample. Because physical space on a VLSI chip must be conserved if at all possible, it is not practical to increase the area used by test circuitry indefinitely. For this reason, as VLSI circuits become increasingly large and complex it becomes increasingly difficult to test them completely.

Figure 2:
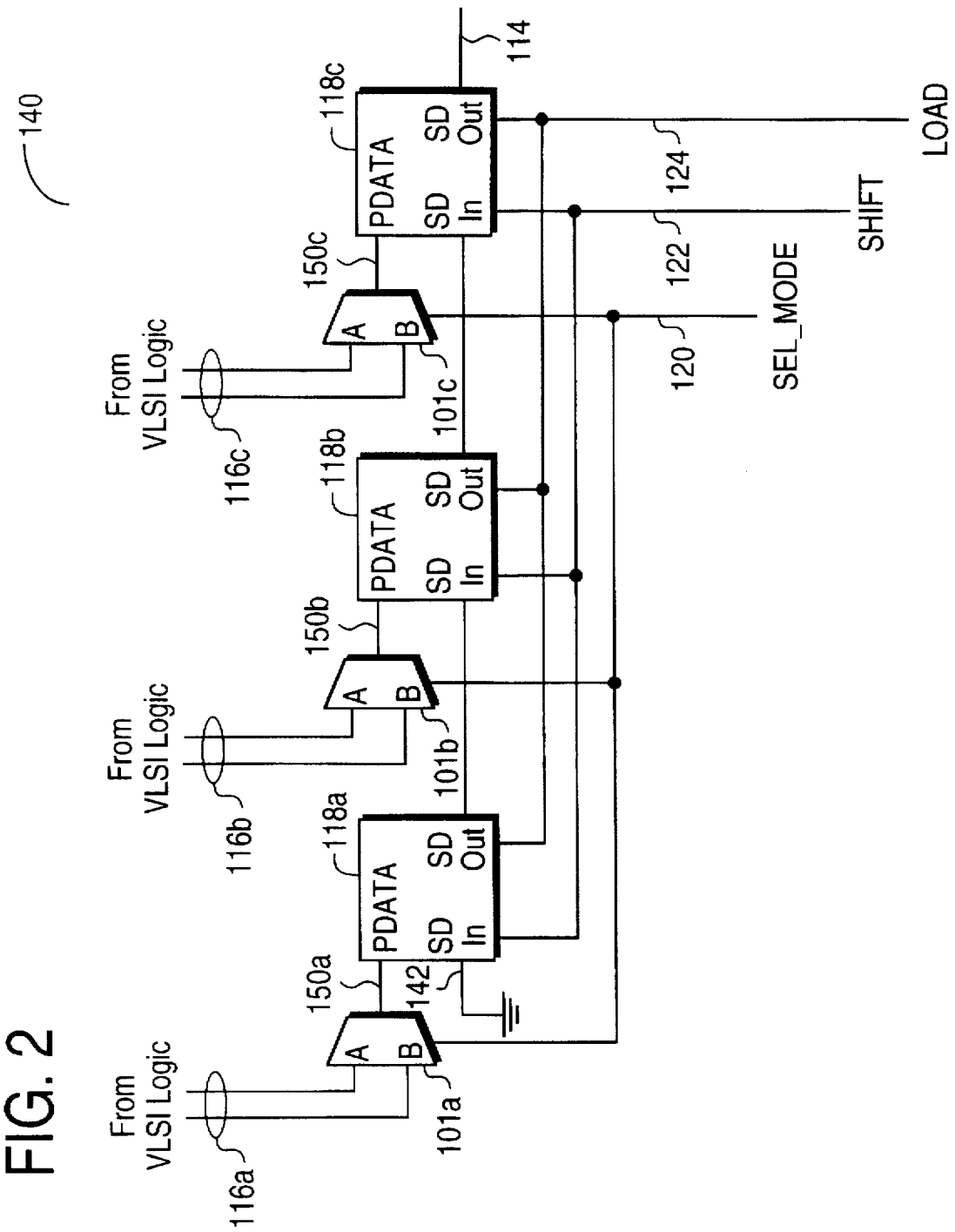
FIG. 2 is a block diagram of test circuitry according to one embodiment of the present invention.

FIG. 2 is a block diagram of test circuitry 140 according to one embodiment of the present invention. Test circuitry 140 resides on a VLSI chip and is coupled to VLSI logic circuitry through parallel inputs 116. Test circuitry 140 is also connected to an external VLSI tester through serial data output 114. Test circuitry 140 allows twice as many nodes of VLSI logic circuitry 102 to be sampled as prior art test circuits, yet no appreciable increase in area usage is realized. For this embodiment, the number of nodes sampled is doubled as compared to the prior art, but in other embodiments it is also possible to triple or quadruple the number of nodes sampled without appreciably increasing area usage. For simplicity of illustration, an embodiment sampling twice the number of nodes is shown.

Test circuitry 140 includes scan cells 118a, 118b and 118c. Three scan cells are shown for clarity. In practical embodiments, many more scan cells are present. Scan cells 118 are interconnected through their SDIN and SDOUT inputs and outputs. For example, scan cell 118a is shown comprising the lead scan cell of a shift register formed by scan cells 118a, 118b and 118c. Therefore SDIN input 142 of scan cell 118a is connected to ground. The SDOUT output of scan cell 118a is connected to the SDIN input of scan cell 118b. The SDOUT output of scan cell 118b is connected to SDIN input of scan cell 118c. The SDOUT output of scan cell 118c is connected to a VLSI tester (not shown), through serial data out output 114. Operation of scan cells 118 is controlled by SHIFT signal 122 and LOAD signal 124 which originate in control logic on the same VLSI chip that includes test circuitry 140. Operations of scan cells 118 such as SHIFT and LOAD operations are synchronized with a common clock signal (not shown). During test operations, logic states of internal nodes of VLSI logic circuit 102 appear on parallel inputs 116a, 116b and 116c. For example, parallel inputs 116a include two inputs connected to an A and a B input of selector circuit 101a respectively. Selector circuit 101a is coupled to a select mode signal (SEL__MODE) originating in control logic on the VLSI chip. The select mode input causes one of the logic states on either input A or input B of selector circuit 101a to be output on output 150a of selector circuit 101a. Selector circuit output 150a is connected to the PDATA input of scan cell 118a. Selector circuits 101b and 101c operate similarly to selector circuit 101a. When LOAD signal 124 is active and, for example, SEL__MODE input 120 is in a low voltage state, logic states on the A inputs of selector circuits 101a, 101b and 101c are selected to appear on selector circuit outputs 150a, 150b and 150c. In this way, logic states of nodes connected to A inputs of selector circuits 101 are loaded into scan cells 118. When SHIFT signal 122 is active no loading of scan cells takes place. When SHIFT signal 122 is active the logic state stored in scan cell 118a is shifted to scan cell 118b and the logic state stored in scan cell 118b is shifted to scan cell 118c. At the same time, the logic state stored in scan cell 118c is output to serial data output 114 and sent to an external VLSI tester for evaluation.

Thus, this embodiment allows testing of one set of nodes of VLSI logic circuitry 102 at one time and testing of another set of nodes at another time, depending on the state of the SEL__MODE input 120. Other embodiments could allow for the testing at various times of more than two sets of nodes. For example, other embodiments could include four parallel data lines 116 rather that two. In such an embodiment two SEL__MODE inputs 120 would be required. The four possible combinations of logic states of two select mode inputs 120 would each select one of the four parallel data inputs 116.

The present invention provides the advantage of testing many more nodes of VLSI logic circuitry 102 without significantly increased area usage. One of the reasons is that scan cells such as scan cell 118 require a relatively large amount of area as compared to a selector circuit such as selector circuit 101. According to the present invention both a selector circuit 101 and a scan cell 118 can occupy almost the same area as occupied by a single scan cell 118 in conventional test circuits.

Another advantage provided by the present invention is that increased testing capability is realized without adding to clock load. This is because each scan cell requires its own clock signal. When additional scan cells are added to a test circuit, each added scan cell increases the load on the source clock. Such a change usually requires complete simulation of the affected circuitry and redesign of the circuitry if increased clock loads have created timing errors. With the present invention, on the other hand, clock load is not increased with increased testing capability, and therefore no re-simulation or redesign of clock circuitry is required.

Figure 3:
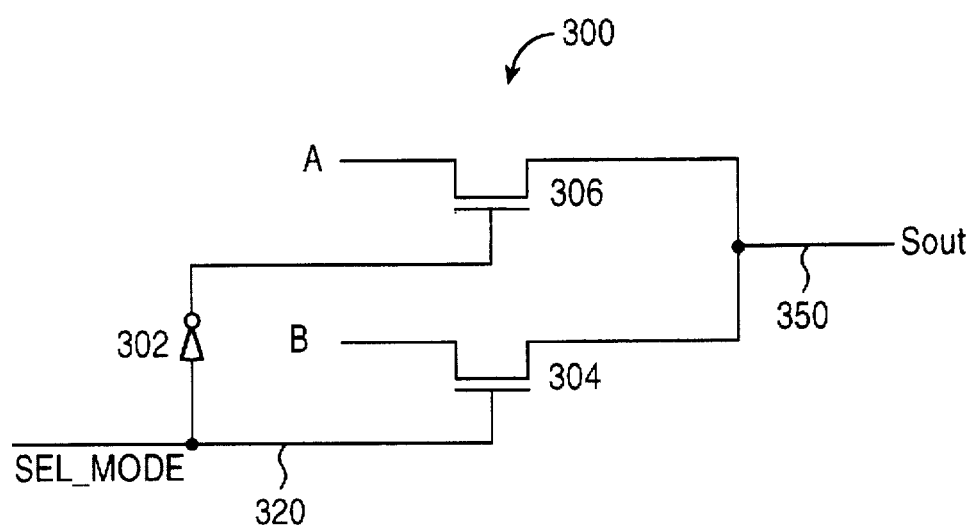
FIG. 3 is a circuit diagram of a selector circuit of one embodiment of the present invention.

FIG. 3 shows a circuit diagram of a selector circuit according to one embodiment of the present invention. Selector circuit 300 functions to choose between inputs A and B. Under control of SEL__MODE input 320, selector circuit 300 outputs either A or B on select output SOUT 350. SEL__MODE input 320 is connected to an input of inverter 302 and to the gate of transistor 304. The source of transistor 304 is connected to signal B and the drain of transistor 304 is connected to SOUT 350. The output of inverter 302 is connected to the gate of transistor 306. The source of transistor 306 is connected to signal A and the drain of transistor 306 is connected to SOUT 350. When a low voltage or a zero voltage is on select mode input 320, transistor 304 receives a low or zero voltage on its gate, and is therefore turned off. Inverter 302 inverts the low or zero voltage to a high voltage at the gate of transistor 306. In this way transistor 306 is turned on and signal a is passed to SOUT 350. Similarly when a high voltage is present on SEL_MODE input 320, transistor 306 is turned off and transistor 304 is turned on, passing signal B to SOUT 350.

This selector circuit embodiment uses only n-type transistors 304 and 306 as pass gates. P-type transistors are eliminated, thus reducing area usage. Other embodiments could use other types of circuits as selector circuits.

What is claimed is:

1. An apparatus for scan testing of an integrated circuit (IC) by sampling logic states of a plurality of nodes of the integrated circuit, comprising:

a selector circuit coupled to the plurality of nodes of the integrated circuit and to a scan cell, the selector circuit comprising a plurality of control inputs, wherein each combination of logic states of the plurality of control inputs causes the selector circuit to output to the scan cell a logic state of a particular one of the plurality of nodes.

2. The apparatus of claim 1, wherein the scan cell comprises a storage element that temporarily stores the logic state.

3. The apparatus of claim 2, wherein the select circuit comprises:

a first n-type metal oxide semiconductor (NMOS) transistor with a gate terminal coupled to a control input of the plurality of control inputs and to an input of an inverter, a source terminal coupled to a first node of the plurality of nodes, and a drain terminal coupled to an input of the scan cell; and a second NMOS transistor with a gate terminal coupled to an output of the inverter, a source terminal coupled to a second node of the plurality of nodes, and a drain terminal coupled to the input of the scan cell.

4. The apparatus of claim 1, wherein the selector circuit is one of a plurality of selector circuits, and the scan cell is one of a plurality of scan cells, each associated with one of the plurality of selector circuits, the plurality of scan cells forming a shift register such that each of the plurality of scan cells receives a logic state of a node of the integrated circuit from an associated selector circuit in parallel, and the shift register outputs serial data comprising logic states that each of the plurality of scan cells received.

5. A very large scale integrated (VLSI) circuit comprising digital logic and further comprising:

test control logic that controls testing of the digital logic and is coupled to a testing device external to the VLSI circuit;

scan circuitry coupled to the test control logic, comprising:

a plurality of selector circuits, each coupled to an associated one of a plurality of scan cells, to the test control logic, and to the digital logic wherein a select signal from the test control logic causes the selector circuit to output a logic state of one of a plurality of nodes of the digital circuitry to an associated scan cell.

6. The VLSI circuit of claim 5, wherein the plurality of scan cells form a shift register that is coupled to receive logic states of nodes of the digital logic in parallel and coupled to output the logic states in serial to the testing device.

7. The VLSI circuit of claim 6, wherein the test control logic causes the selector circuit to output a logic state of one of two nodes of the digital logic and wherein the selector circuit comprises:

a first n-type metal oxide semiconductor (NMOS) transistor with a gate terminal coupled to a control input of the plurality of control inputs and to an input of an inverter, a source terminal coupled to a first node of the plurality of nodes, and a drain terminal coupled to an input of the scan cell;

a second NMOS transistor with a gate terminal coupled to an output of the inverter, a source terminal coupled to a second node of the plurality of nodes, and a drain terminal coupled to the input of the scan cell.

8. The VLSI circuit of claim 7, wherein each of the plurality of scan cells comprise a flip-flop that stores a logic state and responds to a load signal from the test control logic by storing a logic state of one of a plurality of nodes of the digital logic from an associated selector circuit and responds to a shift signal from the test control logic by shifting the logic state to an adjacent scan cell, load and shift operations occurring on the active edge of a clock signal.

* * * * *